United States Patent
Chakravarty et al.

(10) Patent No.: US 9,620,373 B1
(45) Date of Patent: Apr. 11, 2017

(54) METHODS FOR FABRICATING SEMICONDUCTOR OR MICROMACHINED DEVICES WITH METAL STRUCTURES AND METHODS FOR FORMING SELF-ALIGNED DEEP CAVITY METAL STRUCTURES

(71) Applicant: Globalfoundries Singapore Pte. Ltd., Singapore (SG)

(72) Inventors: Siddharth Chakravarty, Singapore (SG); Rakesh Kumar, Singapore (SG); Pradeep Yelehanka, Singapore (SG); Sharath Poikayil Satheesh, Singapore (SG); Natarajan Rajasekaran, Singapore (SG)

(73) Assignee: GLOBALFOUNDRIES SINGAPOREPTE. LTD., Singapore (SG)

( * ) Notice: Subject to any disclaimer, the term of this patent is extended or adjusted under 35 U.S.C. 154(b) by 0 days.

(21) Appl. No.: 14/985,800

(22) Filed: Dec. 31, 2015

(51) Int. Cl.
*H01L 21/467* (2006.01)
*H01L 21/306* (2006.01)
*H01L 21/308* (2006.01)
*H01L 21/285* (2006.01)
*H01L 29/40* (2006.01)
*H01L 21/443* (2006.01)

(52) U.S. Cl.
CPC .... *H01L 21/30604* (2013.01); *H01L 21/2855* (2013.01); *H01L 21/308* (2013.01); *H01L 21/30608* (2013.01); *H01L 21/443* (2013.01); *H01L 21/467* (2013.01); *H01L 29/401* (2013.01)

(58) Field of Classification Search
CPC ............. H01L 21/0272; H01L 21/2855; H01L 21/30604; H01L 21/308; H01L 21/3083; H01L 21/443; H01L 21/467; H01L 21/475; H01L 29/401
See application file for complete search history.

(56) References Cited

U.S. PATENT DOCUMENTS

| | | | | |
|---|---|---|---|---|
| 4,403,396 A * | 9/1983 | Stein | ................. | H01L 21/30608 257/284 |
| 5,360,697 A * | 11/1994 | Mehra | ............... | H01L 21/28512 216/47 |
| 6,245,684 B1 * | 6/2001 | Zhao | ................. | H01L 21/30604 257/E21.219 |
| 2009/0111061 A1 * | 4/2009 | Chau | ................... | H01L 21/0331 430/323 |

* cited by examiner

*Primary Examiner* — Stephen W Smoot
(74) *Attorney, Agent, or Firm* — Lorenz & Kopf, LLP

(57) ABSTRACT

Methods for fabricating semiconductor or micromachined devices with metal structures and methods for forming self-aligned deep cavity metal structures are provided. A method for fabricating a device with a metal structure includes patterning a mask with an opening perimeter bounding an opening over a substrate. The method includes performing an isotropic etch to etch a shallow portion of the substrate exposed by the opening and a shallow portion of the substrate underlying the opening perimeter of the mask. The method also includes performing an anisotropic etch to etch a deep portion of the substrate exposed by the mask opening and a deep portion of the substrate underlying the opening perimeter of the mask to form a cavity having a bottom surface. Further, the method includes depositing metal over the mask, into the mask opening and onto the bottom surface, wherein the metal on the bottom surface forms the metal structure.

20 Claims, 5 Drawing Sheets

METHODS FOR FABRICATING SEMICONDUCTOR OR MICROMACHINED DEVICES WITH METAL STRUCTURES AND METHODS FOR FORMING SELF-ALIGNED DEEP CAVITY METAL STRUCTURES

TECHNICAL FIELD

The technical field generally relates to metallization in semiconductor or micromachined devices, and more particularly, to forming metal structures within high depth-to-width aspect ratio cavities.

BACKGROUND

With the continued scaling of semiconductor or micromachined device dimensions, it is increasingly difficult to form metal structures in deep cavities. Specifically, as scaling increases, the aspect ratio of deep cavities increases and successful metallization of deep cavities becomes more difficult.

A conventional technique for metallizing deep cavities uses a shadow mask process whereby a mask of a desired pattern is placed between the deposition source and the target substrate, so that only material that passes through openings in the mask is deposited on the substrate. The shadow mask process requires special tools and fixtures to handle the shadow mask. Therefore, shadow mask processes exhibit low throughput. Further, shadow mask processes utilize an expensive, non-reusable mask. Also, shadow mask processes suffer from poor pattern resolution and misalignment problems. While the shadow mask process is prevalent, it is generally not compatible with a CMOS foundry.

Another technique for metallizing deep cavities includes spray coating whereby a fine mist is deposited to form a mask over a target substrate before a metal is deposited through the spray coated mask. However, spray coating processes are typically expensive and also exhibit low throughput. As a result, this technique is generally limited to research and development facilities and is rarely used in a production environment.

Deep cavity metallization may be useful in the fabrication of a number of semiconductor or micromachined devices, such as for forming micro-electromechanical systems (MEMS) devices. Such devices may include metallized cavity structures, such as floating metal structures that are not connected electrically. However, deep cavity metallization suffers from difficulties as aspect ratio increases.

Accordingly, it is desirable to provide simpler and more efficient CMOS compatible methods for forming metal structures in deep cavities. Also, it is desirable to provide alternative methods for fabricating semiconductor or micromachined devices with metal structures and/or improved methods for forming self-aligned deep cavity metal structures. It is desirable to offer methods that overcome limitations of conventional CMOS foundry compatibility with MEMS process techniques in applications which require patterning of metal in deep trenches, cavities or pad openings. Further, it is desirable to provide methods for fabricating semiconductor or micromachined devices that minimize shadowing effects, pattern distortion and misalignment inherent to conventional processing. Furthermore, other desirable features and characteristics will become apparent from the subsequent detailed description and the appended claims, taken in conjunction with the accompanying drawings and this background.

BRIEF SUMMARY

Methods for fabricating semiconductor or micromachined devices with metal structures and methods for forming self-aligned deep cavity metal structures are provided. In an embodiment, a method for fabricating a semiconductor or micromachined device with a metal structure includes patterning a mask over a substrate, wherein the mask includes an opening perimeter bounding an opening. The method includes performing an isotropic etch process to etch a shallow portion of the substrate exposed by the opening and to etch a shallow portion of the substrate underlying the opening perimeter of the mask. The method also includes performing an anisotropic etch process to etch a deep portion of the substrate exposed by the mask opening and to etch a deep portion of the substrate underlying the opening perimeter of the mask to form a cavity having a bottom surface. Further, the method includes depositing metal over the mask, into the mask opening and onto the bottom surface within the cavity, wherein the metal on the bottom surface and disposed within the cavity forms the metal structure.

In another exemplary embodiment, a method for fabricating a semiconductor or micromachined device with a metal structure includes patterning a mask over a substrate. The mask includes an opening perimeter bounding an opening having a width. The method also includes etching the substrate through the opening to form a cavity having an upper end adjacent the mask and a bottom surface. The upper end of the cavity has a maximum width and the bottom surface has a minimum width greater than the width of the opening. The method further includes depositing metal over the mask, into the mask opening and onto the bottom surface within the cavity. The metal on the bottom surface and disposed within the cavity forms the metal structure.

In yet another exemplary embodiment, a method for forming a self-aligned deep cavity metal structure is provided. The method includes exposing a selected region of a substrate. The method further includes performing an isotropic etch process to etch a shallow portion of the selected region of the substrate and an adjacent portion of the substrate adjacent the shallow portion of the selected region of the substrate to form a shallow recess. Also, the method includes performing an anisotropic etch process to etch a deep portion of the substrate exposed by the shallow recess to form a cavity having a bottom surface. The method further includes selectively depositing metal into the cavity and onto the bottom surface, wherein the metal on the bottom surface of the cavity forms the metal structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
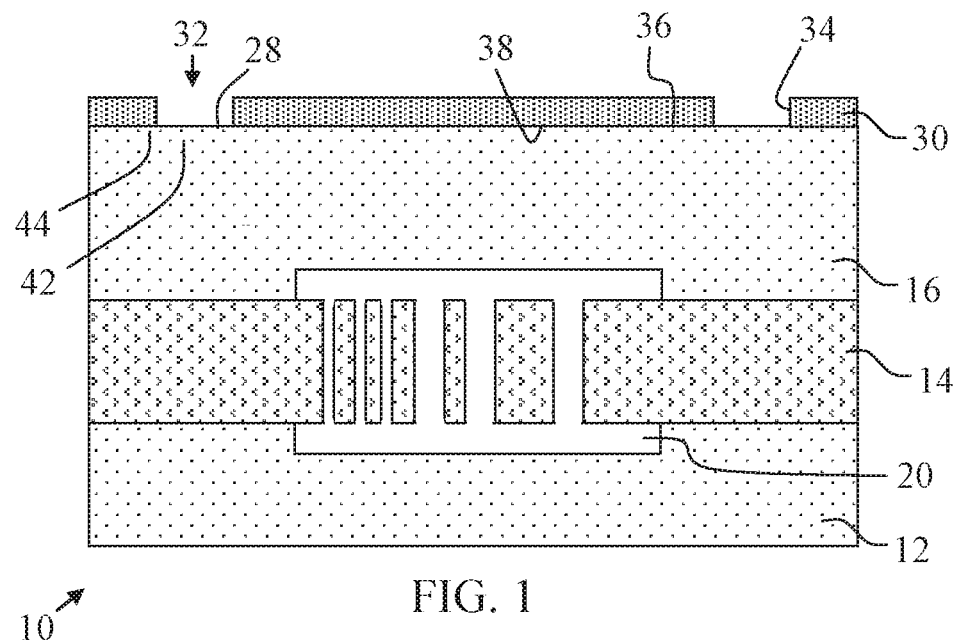
FIGS. 1, 3, 5, 7 and 9 are cross-sectional views illustrating a process for fabricating a semiconductor or micromachined device with metal structures according to an exemplary embodiment.

The following detailed description is merely exemplary in nature and is not intended to limit the methods for fabricating semiconductor or micromachined devices with metal structures and/or methods for forming self-aligned deep cavity metal structures. Furthermore, there is no intention to be bound by any expressed or implied theory presented in the preceding technical field, background or brief summary, or in the following detailed description.

For the sake of brevity, conventional techniques related to semiconductor or micromachined device fabrication may not be described in detail herein. Moreover, the various tasks and processes described herein may be incorporated into a more comprehensive procedure or process having additional steps or functionality not described in detail herein. In particular, various steps in the fabrication of semiconductor or micromachined devices are well-known and so, in the interest of brevity, many conventional steps will only be mentioned briefly herein or will be omitted entirely without providing the well-known process details.

As used herein, it will be understood that when an element or layer is referred to as being "over" another element or layer, it may be disposed directly on the other element or layer, or intervening elements or layers may be present. When an element or layer is referred to as being "on" another element or layer, it is directly on and in contact with the other element or layer. Further, spatially relative terms, such as "above", "lower", "upper", "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or an orientation of below in actual practice, with the term "below" merely being employed to describe the orientation in conjunction with the views shown in the accompanying figures. The device may be otherwise oriented (rotated 90 degrees or at other orientations) and the spatially relative descriptors used herein may likewise be interpreted accordingly.

In accordance with the various embodiments herein, self-aligned deep cavity metal structures are formed. The methods described herein may provide for the formation of metal structures at the bottom of high depth-to-width aspect ratio cavities. As used herein, "high depth-to-width aspect ratio cavities" are cavities having a depth-to-width aspect ratio of at least about 15:1. Further, the methods described herein may avoid deposition of metal onto cavity sidewalls. The methods described herein are compatible with CMOS processing and do not require any new equipment set up or configuration for use in existing CMOS foundries. Further, exemplary metal structures formed herein encompass metal patterns, features, pads, and the like.

Figure 2:
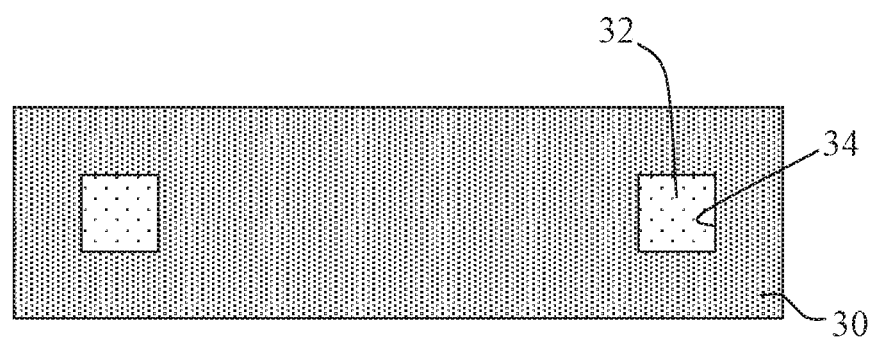
FIGS. 2, 4, 6, 8 and 10 are overhead views of the semiconductor or micromachined device of FIGS. 1, 3, 5, 7 and 9, respectively, illustrating the process for fabricating a semiconductor or micromachined device with metal structures according to the exemplary embodiment.

FIGS. 1-9 are cross-sectional views (in odd-numbered figures) and overhead views (in even-numbered figures) illustrating a process for fabricating a semiconductor or micromachined device 10 according to an exemplary embodiment. As shown in FIGS. 1 and 2, a first semiconductor substrate 12, a second semiconductor substrate 14, and a third semiconductor substrate 16 are provided and processed. It is to be appreciated that various fabrication techniques may be conducted in accordance with the methods described herein to form the semiconductor substrates 12, 14, and 16 as shown. Herein, the term "semiconductor substrate" will be used to encompass semiconductor materials conventionally used in the semiconductor industry from which to make electrical devices, such as those used in semiconductor devices or micromachined devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, ceramics and the like. The semiconductor substrates 12, 14, and 16 may include a compound semiconductor such as silicon carbide, silicon germanide, gallium arsenide, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated. The semiconductor substrates 12, 14, and 16 may be formed of a same material or of different materials as is suitable for the device 10.

An exemplary semiconductor substrate 12, 14 or 16 is formed of high resistivity silicon, such as silicon having resistivity greater than 40 ohm-cm. An exemplary semiconductor substrate 12, 14 or 16 is a bulk silicon wafer. An exemplary semiconductor substrate 12, 14 or 16 has a thickness of from about 250 to about 1000 microns, such as from about 400 to about 600 microns.

In FIG. 1, a structure 20 has been formed in the substrates 12, 14 and 16. For example, various lithography patterning and etching techniques and bonding techniques may be performed to obtain the structure 20 in FIG. 1. In an exemplary embodiment, the structure 20 is a MEMS device structure. After processing to form structure 20, the method herein is utilized to selectively metallize cavities, such as to form bond pads.

As shown in FIGS. 1 and 2, selected regions 28 of the substrate 16 are exposed by a mask 30. Specifically, in an exemplary embodiment, a mask 30 is formed over the substrate 16 and openings 32 are patterned into the mask 30 to expose the selected regions 28. An exemplary mask 30 is a photoresist material; however, any suitable sacrificial material may be used. Each opening 32 exposes a respective selected region 28 of the substrate 16. Each opening 32 is bounded by an opening perimeter 34 formed by the mask 30. In FIG. 2, the opening perimeter 34 is illustrated has having a cross section that is rectangular, and more specifically, square. It is to be appreciated that the opening perimeter 34 may have other cross sectional shapes. The opening 32 has a cross sectional area, i.e., an area bounded by the opening perimeter 34. In FIGS. 1 and 2, the mask 30 is formed on an upper surface 36 of the substrate 16. Further, the mask 30 includes a lower surface 38 that is formed on the upper surface 36 of substrate 16.

Figure 3:
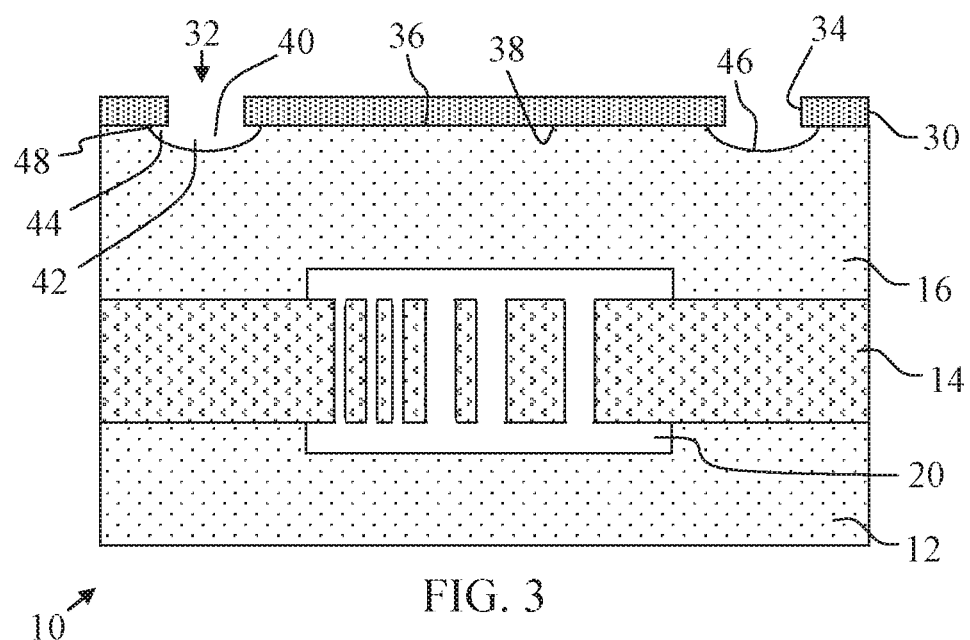
Figure 4:
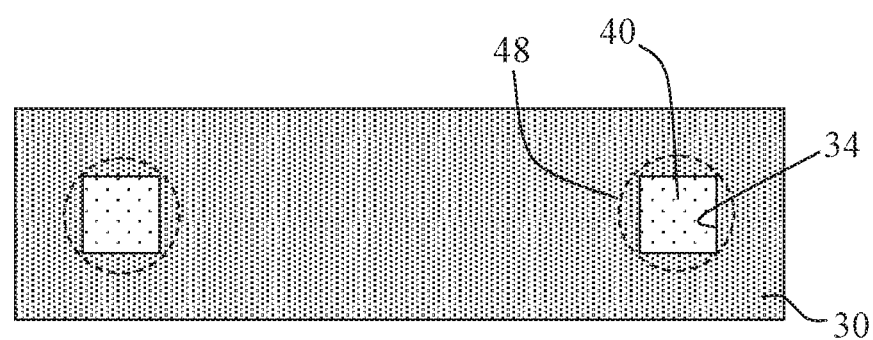

In embodiments and as shown in FIGS. 3 and 4, with continued reference to FIGS. 1 and 2, an etch process is performed to etch a shallow recess 40 into the substrate 16. For example, an isotropic etch process is performed to etch a portion 42 of the substrate 16 that is exposed by the opening 32 in the mask 30 and to etch a portion 44 of the substrate 16 directly underlying the mask 30 adjacent the opening 32. The removal of the portion 44 of the substrate 16 underlying the mask 30 provides an "undercut". The shallow recess 40 is formed with a recess surface 46. As shown, the recess surface 46 intersects the upper surface 36 of the substrate 16 at recess perimeter 48. FIG. 4 illustrates that the isotropic etch process forms the recess perimeter 48 of the shallow recess 40 as having a circular cross section. Further, the shallow recess 40 has a cross sectional area bounded by the recess perimeter 48 that is greater than the cross sectional area of the mask opening 32.

Suitable isotropic etch processes include conventional wet or dry isotropic etch processes that may be selected based upon the material of the semiconductor substrate 16. For example, a suitable dry etch process may be performed with $SF_6$ or with $XeF_2$ may be selected for etching silicon. Alternatively, a suitable wet etch process such as an etch with TMAH or KOH may be selected for etching silicon.

Figure 5:
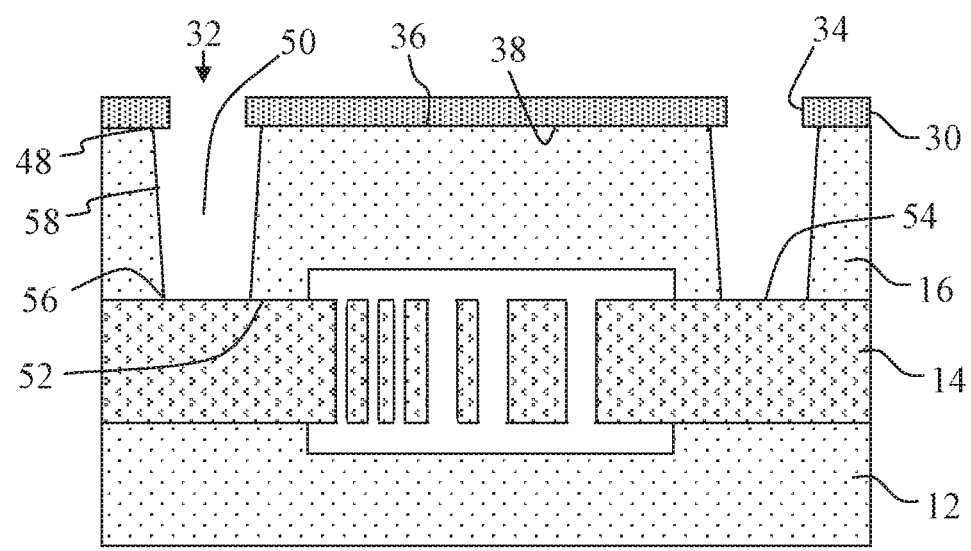
Figure 6:
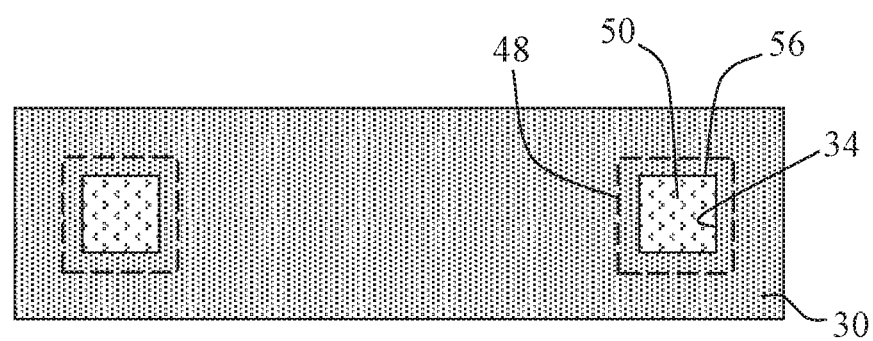

In FIGS. 5 and 6, another etch process is performed to form a deep cavity 50 in the substrate 16. In the illustrated embodiment, the deep cavity 50 terminates on an upper surface 52 of substrate 14, with etching progressing down through the semiconductor substrate 16 and terminating at semiconductor substrate 14; however, deep cavity 50 may terminate within substrate 16 or on substrate 12 as desired depending upon materials of the substrates 12, 14 and further depending upon etch processes employed. In an embodiment and as shown in FIGS. 5 and 6, deep cavity 50 has a bottom surface 54 at the upper surface 52 of substrate 14, at a bottom end of the deep cavity 50. The bottom surface 54 is bounded by a bottom perimeter 56. Further, deep cavity 50 is formed with sloped sidewalls 58. As a result, deep cavity 50 has a minimum cross sectional area at the bottom surface 54 and is bounded by the bottom perimeter 56. Further, deep cavity 50 has a maximum cross sectional area at upper perimeter 48.

As shown in FIG. 6, the upper perimeter 48 may be formed with a rectangular cross section, such as a square cross section as a result of the etch process in FIGS. 5 and 6. Further, the bottom perimeter 56 may also be formed with a rectangular cross section, such as a square cross section as a result of the etch process in FIGS. 5 and 6. The cross sectional area bounded by the upper perimeter 48 is greater than the cross sectional area of the opening 32 bounded by the opening perimeter 34. Further, the cross sectional area bounded by the bottom perimeter 56 is greater than or equal to the cross sectional area of the opening 32 bounded by the opening perimeter 34. Further, the entirety of the sidewalls 58 bounding the deep cavity 50 lie directly under the mask 30, such that only the bottom surface 54 of the deep cavity 50, or a portion of the bottom surface 54 of the deep cavity 50, lies directly under the opening 32.

An exemplary etch process for forming the deep cavity 50 is an anisotropic etch process. The anisotropic etching of the shallow recess surface 46 may result in the change in cross sectional shape of upper perimeter 48 from circular to rectangular. Alternatively the upper perimeter 48 may retain its circular shape after deep cavity 50 is formed. Suitable isotropic etch processes include conventional isotropic etch processes based upon the material of the semiconductor substrate 16. An exemplary process for an anisotropic etch of silicon is a wet etch performed with KOH or TMAH solutions. Another exemplary process for an anisotropic etch of silicon is a dry etch performed using a deep reactive ion etch process. In the former process the region 48 will change shape from circular to rectangular (depending upon the etch depth of region 50), while in the latter dry etch process it may retain the circular perimeter.

In an exemplary embodiment, the deep cavity 50 is formed with a depth, from surface 36 to surface 52 of from about 50 to about 1000 microns, such as from about 100 to about 700 microns, for example from about 500 to about 600 microns. Further, the deep cavity 50 may be formed with a depth-to-width aspect ratio of at least about 15:1, such as from about 15:1 to about 50:1; such as from about 30:1 to about 50:1.

Figure 7:
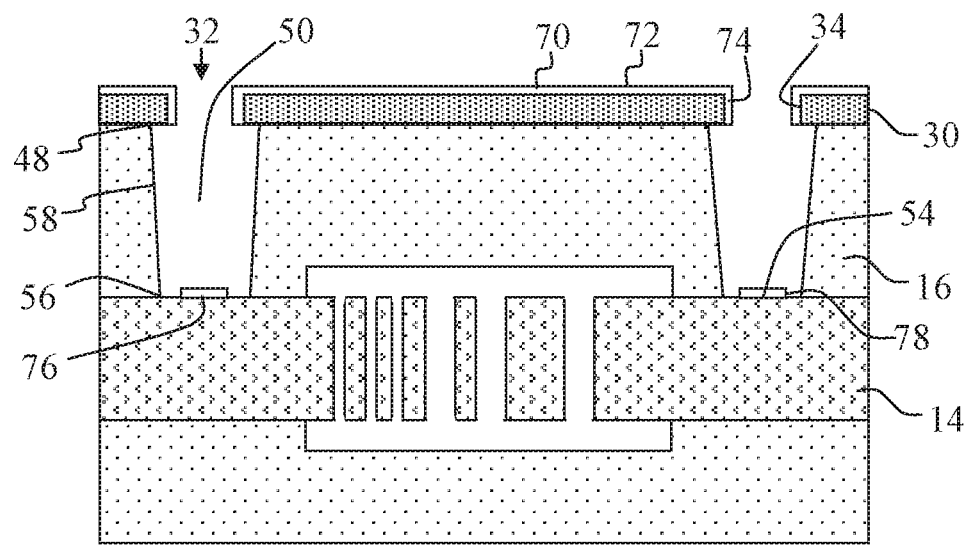
Figure 8:
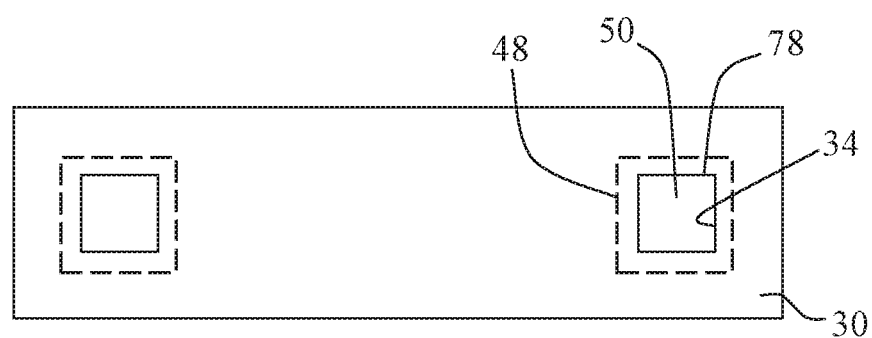

The exemplary method may continue in FIGS. 7-8 with a metallization process. As shown, a metal 70 may be deposited over the mask 30, and into the deep cavity 50, more particularly onto the bottom surface 54 of the deep cavity 50. More specifically, metallization involves formation of a layer of metal 70 resulting in deposition of a portion 76 of the metal layer on the bottom surface 54 of the cavity 50 without filling the deep cavity 50 and also without contact the sidewalls of the deep cavity 50 with metal. As a result, the metal 70 includes a portion 72 lying over the upper surface of the mask 30, a portion 74 on the opening perimeter 34 of the mask 30, and a portion 76 on the bottom surface 54 of the deep cavity 50. The portion 76 of metal 70 formed on the bottom surface 54 of the deep cavity 50 forms a metal structure 76. As shown, the metal structure 76 has a perimeter 78. An exemplary perimeter 78 is directly aligned with the opening perimeter 34 of the mask opening 32.

The deep cavity 50 has a maximum cross sectional area at the upper perimeter 48 that is greater than the cross sectional area of the mask opening 32, and has a minimum cross sectional area at the bottom perimeter 56 around the bottom surface 54 that is greater than or equal to the cross sectional area of the mask opening 32. Because the metal structure 76 is self-aligned with the mask opening 32, the cross sectional area of the metal structure 76 is limited by the cross sectional area of the mask opening 32. Thus, the cross sectional area of the metal structure 76 is not impacted by the processes for etching the deep cavity 50 so long as the processes form the deep cavity 50 with the described cross sectional areas. Also, as a result of the structure and relationship of the mask 30, mask opening 32, and deep cavity 50, no metal 70 is deposited on the sidewalls 58 of the deep cavity 50.

In an exemplary embodiment, the metal deposition process is anisotropic. An exemplary metallization process is sputtering or thin film deposition by evaporation. An exemplary metal 70 is copper, aluminum, gold, silver, or other suitable method for deposition in a unidirectional manner.

Figure 9:
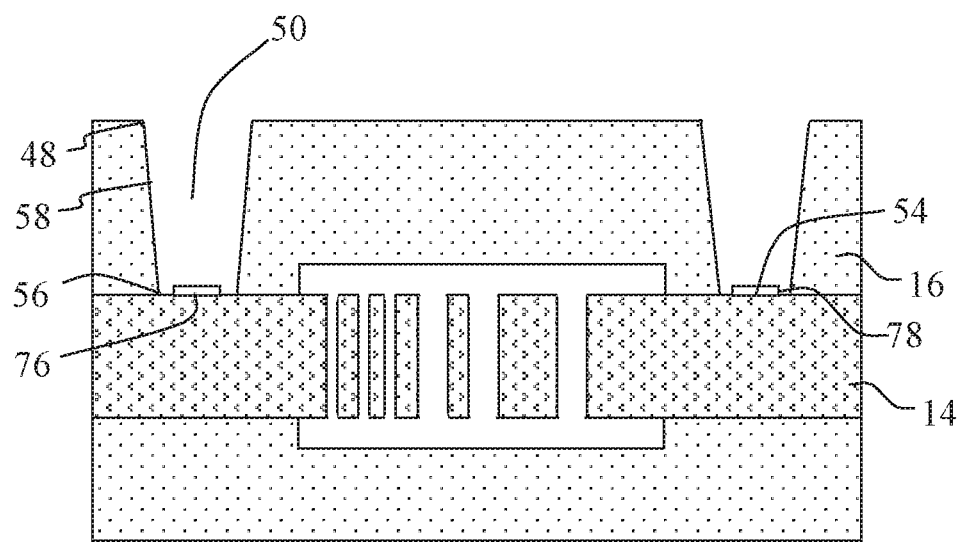
Figure 10:
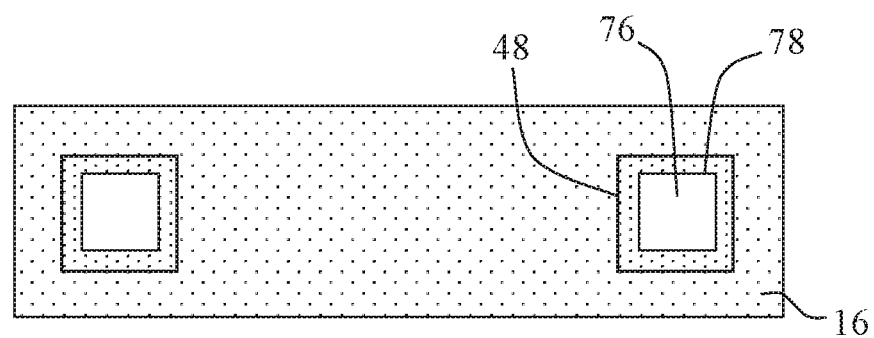

In embodiments and as shown in FIGS. 9 and 10, the mask 30 and the portions 72 and 74 of metal 70 overlying the mask 30 are removed from the device 10. For example, the mask 30 and metal 70 may be removed by using a standard photoresist lift off process in acetone or other standard solvents. As a result, the device 10 is provided with the metal structure 76 formed on the bottom surfaces 54 of each deep cavity 50. The perimeter 78 and cross sectional area of the metal structure 76 is independent of the upper recess perimeter 48 and the bottom recess perimeter 56.

As described herein, the mask is formed over the substrate and is patterned to have the opening that will define the cross section of the later-formed metal structure. The substrate is then etched to form the recess including an undercut recess portion lying directly under the mask. The later metal deposition process aligns the deposited metal with the mask opening while the undercut recess prevents formation of metal on the deep cavity sidewalls.

The process described herein may be used to fabricate metal contacts or buried metallic interconnects for through-wafer and other interconnection purposes by metal deposition at the bottom of the deep cavity. It is contemplated that deep cavities of any desired shape and dimension may be formed and that metal may be deposited therein according to the processes described herein to form any desired metal structure.

Methods to deposit metal on bottom surfaces of deep cavities have been described. In an exemplary embodiment, the methods described herein reduce processing complexity as compared to conventional techniques and provide for compatibility with CMOS foundry processing. Also, the methods described may reduce cost and increase through put to provide for commercial scale use in CMOS device fabrication. Further, the methods described herein can be utilized in MEMS device fabrication and in other devices that need metallized cavity structures, such as floating metal structures that are not connected electrically, or in applications which require patterning of metal in deep trenches, cavities or pad openings. The described methods minimize shadowing effects, pattern distortion and misalignment inherent to conventional processing.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating a semiconductor or micromachined device with a metal structure, the method comprising:
    patterning a mask over a substrate, wherein the mask includes an opening perimeter bounding a mask opening, wherein the opening perimeter is rectangular;
    performing an isotropic etch process to etch a shallow portion of the substrate exposed by the mask opening and a shallow portion of the substrate underlying the opening perimeter of the mask and forming a shallow recess having a substantially circular cross section;
    performing an anisotropic etch process to etch a deep portion of the substrate exposed by the mask opening and a deep portion of the substrate underlying the opening perimeter of the mask to form a cavity having a bottom surface; and
    depositing metal over the mask, into the mask opening and onto the bottom surface, wherein the metal on the bottom surface forms the metal structure.

2. The method of claim 1 further comprising removing the mask and the metal overlying the mask from the substrate.

3. The method of claim 1 wherein the mask opening has a first area, and wherein the bottom surface of the cavity has a second area greater than or equal to the first area.

4. The method of claim 3 wherein the substrate has an upper surface in contact with the mask, wherein the upper surface bounds the cavity at an upper end, and wherein, after performing the anisotropic etch process, the upper end has a third area greater than the first area and greater than the second area.

5. The method of claim 1 wherein performing the anisotropic etch process comprises forming the bottom surface of the cavity with a substantially rectangular cross section.

6. The method of claim 5 wherein the substrate has an upper surface in contact with the mask, wherein the upper surface bounds the cavity at an upper end, and wherein performing the anisotropic etch process comprises forming the upper end of the cavity with a substantially rectangular cross section.

7. The method of claim 1 wherein depositing the metal over the mask, into the mask opening and onto the bottom surface comprises sputtering the metal over the mask, into the mask opening and onto the bottom surface.

8. The method of claim 1 wherein the cavity has a depth-to-width aspect ratio of at least about 15:1.

9. The method of claim 1 wherein the cavity has a depth-to-width aspect ratio of from about 30:1 to about 50:1.

10. A method for fabricating a semiconductor or micromachined device with a metal structure, the method comprising:
    patterning a mask over a substrate, wherein the mask includes an opening perimeter bounding a mask opening, wherein the mask opening has a width;
    performing an isotropic etch process through the mask opening to etch a shallow portion of the substrate and performing an anisotropic etch process through the mask opening to etch a deep portion of the substrate to form a cavity having an upper end adjacent the mask and a bottom surface, wherein the upper end of the cavity has a maximum width, and wherein the bottom surface has a minimum width greater than the width of the mask opening; and
    depositing metal over the mask, into the mask opening and onto the bottom surface, wherein the metal on the bottom surface forms the metal structure.

11. The method of claim 10 wherein the opening perimeter is rectangular, wherein performing the isotropic etch process to etch the shallow portion of the substrate comprises forming a shallow recess having a substantially circular cross section, and wherein performing the anisotropic etch process to etch the deep portion of the substrate comprises forming the bottom surface of the cavity with a substantially rectangular cross section.

12. The method of claim 10 further comprising removing the mask and the metal overlying the mask from the substrate.

13. The method of claim 10 wherein depositing metal over the mask, into the mask opening and onto the bottom surface comprises anisotropically depositing the metal.

14. The method of claim 10 wherein the cavity has a depth-to-width aspect ratio of at least about 15:1.

15. The method of claim 10 wherein the cavity has a depth-to-width aspect ratio of from about 30:1 to about 50:1.

16. A method for forming a self-aligned deep cavity metal structure, the method comprising:
    exposing a top surface of a substrate in a selected region of the substrate;
    performing an isotropic etch process to etch a shallow portion of the selected region of the substrate and an adjacent portion of the substrate adjacent the shallow portion of the selected region of the substrate to form a shallow recess;
    performing an anisotropic etch process to etch a deep portion of the substrate exposed by the shallow recess to form a cavity having a bottom surface, wherein the cavity is bound by sidewalls formed from the substrate and extending from the top surface of the substrate to the bottom surface; and selectively depositing metal into the cavity and onto the bottom surface, wherein the metal on the bottom surface forms the self-aligned deep cavity metal structure.

17. The method of claim 16 wherein selectively depositing the metal into the cavity and onto the bottom surface forms an annular gap separating a perimeter of the self-aligned deep cavity metal structure from the sidewalls.

18. The method of claim 16 further comprising patterning a mask over the substrate, wherein the mask includes an opening perimeter bounding a mask opening, wherein the isotropic etch process and the anisotropic etch process are performed through the mask opening, and wherein no portion of the sidewalls lies directly under the mask opening.

19. The method of claim 18 wherein the sidewalls are substantially linear from top surface of the substrate to the bottom surface.

20. The method of claim 19 wherein, when selectively depositing the metal into the cavity and onto the bottom surface, no metal is deposited on the sidewalls.

\* \* \* \* \*